(12) United States Patent
Cheng et al.

(10) Patent No.: US 10,084,094 B1
(45) Date of Patent: Sep. 25, 2018

(54) WRAPPED SOURCE/DRAIN CONTACTS WITH ENHANCED AREA

(71) Applicant: INTERNATIONAL BUSINESS MACHINES CORPORATION, Armonk, NY (US)

(72) Inventors: Kangguo Cheng, Schenectady, NY (US); Zuoguang Liu, Schenectady, NY (US); Heng Wu, Altamont, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/462,420

(22) Filed: Mar. 17, 2017

(51) Int. Cl.
| | |
|---|---|
| H01L 29/78 | (2006.01) |
| H01L 29/66 | (2006.01) |
| H01L 21/02 | (2006.01) |
| H01L 21/8234 | (2006.01) |
| H01L 21/306 | (2006.01) |
| H01L 21/308 | (2006.01) |
| H01L 21/311 | (2006.01) |
| H01L 23/528 | (2006.01) |
| H01L 27/088 | (2006.01) |

(52) U.S. Cl.
CPC ...... H01L 29/7851 (2013.01); H01L 21/0217 (2013.01); H01L 21/02164 (2013.01); H01L 21/3083 (2013.01); H01L 21/30604 (2013.01); H01L 21/31111 (2013.01); H01L 21/823431 (2013.01); H01L 23/5283 (2013.01); H01L 27/0886 (2013.01); H01L 29/66795 (2013.01)

(58) Field of Classification Search
CPC ............ H01L 27/0886; H01L 27/0924
See application file for complete search history.

(56) References Cited

U.S. PATENT DOCUMENTS

| | | | |
|---|---|---|---|
| 9,159,794 B2 | 10/2015 | Yu et al. | |
| 9,362,285 B2 | 6/2016 | Basker et al. | |
| 9,397,197 B1 | 7/2016 | Guo et al. | |
| 9,425,310 B2 | 8/2016 | Yang | |
| 9,653,461 B2 * | 5/2017 | Huang | H01L 29/66545 |
| 9,842,909 B2 * | 12/2017 | Maeda | H01L 29/665 |
| 9,972,494 B1 | 5/2018 | Bentley et al. | |
| 9,972,537 B2 | 5/2018 | Jacob | |
| 2008/0296681 A1 | 12/2008 | Georgakos et al. | |
| 2011/0147840 A1 | 6/2011 | Cea et al. | |
| 2011/0298058 A1 | 12/2011 | Kawasaki et al. | |
| 2014/0001520 A1 | 1/2014 | Glass et al. | |

(Continued)

OTHER PUBLICATIONS

Non Final Office Action for U.S. Appl. No. 15/803,983 dated Jun. 18, 2018 (7 pages).

Primary Examiner — Quoc Hoang
(74) Attorney, Agent, or Firm — Tutunjian & Bitetto, P.C.; Vazken Alexanian (57) ABSTRACT

Semiconductor device and methods of forming the same include forming a first dielectric layer over a semiconductor fin. A second dielectric layer is formed around the first dielectric layer. The semiconductor fin is recessed below a height of the first and second dielectric layers. Source and drain extensions are grown from the recessed semiconductor fin. The first dielectric layer is recessed to expose an underside of and sidewalls of the source/drain extensions. Conductive contacts are formed around exposed portions of the source/drain extensions.

5 Claims, 5 Drawing Sheets

(56) References Cited

U.S. PATENT DOCUMENTS

2014/0159159 A1 6/2014 Steigerwald et al.
2016/0148936 A1 5/2016 Xu et al.
2016/0254186 A1 9/2016 Leib et al.

* cited by examiner

WRAPPED SOURCE/DRAIN CONTACTS WITH ENHANCED AREA

BACKGROUND

Technical Field

The present invention generally relates to semiconductor device design and fabrication and, more particularly, to the formation of transistors with source and drain regions that have enhanced contact area and reduced contact resistance.

Description of the Related Art

Field effect transistors (FETs) generally include a channel region, a source region, and a drain region. A gate structure formed near the channel region applies an electric field to the channel region, providing the triggering effect of the transistor, thereby controlling the flow of current between the source and the drain regions.

Various structures are used to enhance the performance of FETs. In particular, FETs may be formed on fin structures, where the channel region is a fin of semiconductor material and the gate is formed over the fin. In such a structure, the source and drain regions may also be formed as fins initially, but alterations may be made to these structures to change the characteristics of the device.

For example, contact resistance between the source/drain regions and the conductive contacts to the FET plays a role in the performance of devices at small pitch sizes. The contact resistance may be decreased by increasing the contact area. However, conventional FETs are limited in the contact area that can be accessed, which limits how much of a decrease in contact resistance can be achieved.

SUMMARY

A method of forming a semiconductor device includes forming a first dielectric layer over a semiconductor fin. A second dielectric layer is formed around the first dielectric layer. The semiconductor fin is recessed below a height of the first and second dielectric layers. Source and drain extensions are grown from the recessed semiconductor fin. The first dielectric layer is recessed to expose an underside of and sidewalls of the source/drain extensions. Conductive contacts are formed around exposed portions of the source/drain extensions.

A method of forming a semiconductor device includes anisotropically etching a semiconductor substrate to form a semiconductor fin in a region covered by a fin mask. A silicon nitride layer is formed over the semiconductor fin. A silicon dioxide layer is formed around the first silicon nitride layer. The silicon nitride layer and the silicon nitride layer are polished to a height of the fin mask. The fin mask is etched away. The semiconductor fin is recessed below a height of the silicon nitride layer and the silicon dioxide layers. Source/drain extensions are grown from the recessed semiconductor fin. The silicon nitride layer is recessed to expose an underside of and sidewalls of the source/drain extensions. Conductive contacts are formed around exposed portions of the source/drain extensions.

A semiconductor device include a semiconductor fin. A fin extension is formed on respective source and drain regions of the semiconductor fin that extend vertically and laterally beyond boundaries of the semiconductor fin. A first dielectric layer is formed on sidewalls of the semiconductor fin, leaving at least a portion of sidewalls and an underside of the fin extension uncovered. Conductive contacts are formed in contact with a top surface, an underside, and sidewalls of the respective fin extensions.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention decrease the contact resistance at field effect transistor (FET) source and drain regions by increasing the contact area of these structures. Whereas conventional FETs often form contacts along the top surfaces of source and drain fin extensions, the present embodiments provide wrap-around contacts that take advantage of the surface area along the underside the source and drain fin extensions as well as along the body of the fins themselves.

In some embodiments of the present invention, a separate spacer layer is deposited before shallow trench isolation (STI), providing different STI materials in active and non-active regions. The materials can then be selectively etched back to expose portions of the source/drain structures before depositing the contact material. In one particular embodiment, a layer of silicon nitride is deposited before an STI oxide fill and is used as the supporting structure for the epitaxial growth of source/drain extensions. The present embodiments thereby increase the contact area of the source and drain regions without any STI loss at the middle-of-line.

Figure 1:
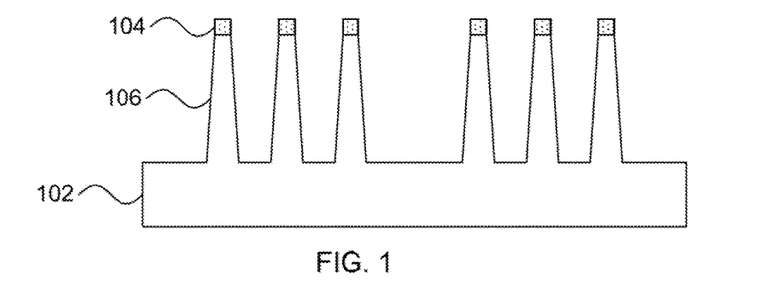
FIG. 1 is a cross-sectional diagram of a step in the formation of a semiconductor device in accordance with one embodiment of the present invention.

Referring now to FIG. 1, a cross sectional diagram of a step in the formation of a FET is shown. Fins 106 are formed in a semiconductor substrate 102. The fins 106 may be formed using an anisotropic etch such as reactive ion etching (RIE) that selectively removes material from the semiconductor substrate 102 in regions that are not protected by fin masks 104. It should be understood that the fin masks 104 may be formed from any appropriate masking material, but silicon carbon oxygen (SiCO) is specifically contemplated. As used herein, the term "selective" in reference to a material removal process denotes that the rate of material removal for a first material is greater than the rate of removal for at least another material of the structure to which the material removal process is being applied.

The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, the fin structures 106 can be formed by spacer imaging transfer.

Figure 2:
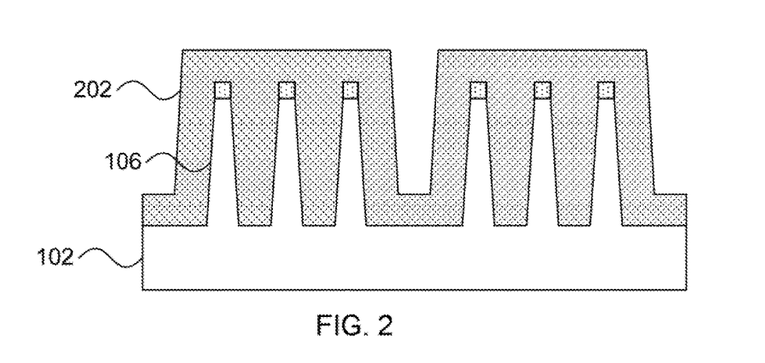
FIG. 2 is a cross-sectional diagram of a step in the formation of a semiconductor device in accordance with one embodiment of the present invention.

Referring now to FIG. 2, a cross sectional diagram of a step in the formation of a FET is shown. A dielectric layer 202 is conformally formed over the fins 106. It is specifically contemplated that the dielectric layer 202 may be formed from, e.g., silicon nitride, but any appropriate dielectric material that may be used instead.

The dielectric layer 202 may be formed by any appropriate process including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 3:
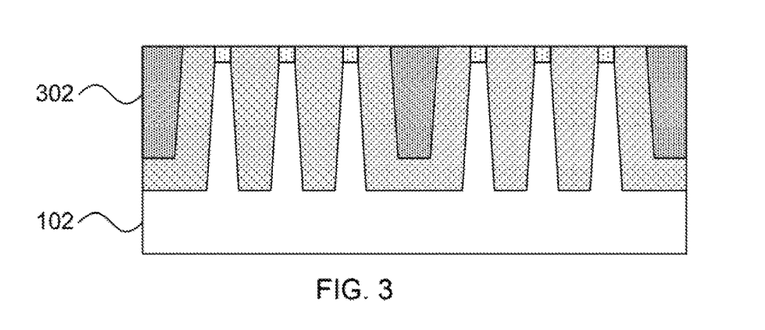
FIG. 3 is a cross-sectional diagram of a step in the formation of a semiconductor device in accordance with one embodiment of the present invention.

Referring now to FIG. 3, a cross sectional diagram of a step in the formation of a FET is shown. An STI material is deposited over and around the dielectric layer 202. It is specifically contemplated that the STI layer 302 may be formed from, e.g., silicon dioxide, but it should be understood that any appropriate dielectric material may be used instead. After the STI material is deposited, a polishing process reduces the level down to the fin caps 104.

The polishing process may include, for example, chemical mechanical planarization (CMP). CMP is performed using, e.g., a chemical or granular slurry and mechanical force to gradually remove upper layers of the device. The slurry may be formulated to be unable to dissolve, for example, the material of the fin caps 104, resulting in the CMP process's inability to proceed any farther than that layer.

Figure 4:
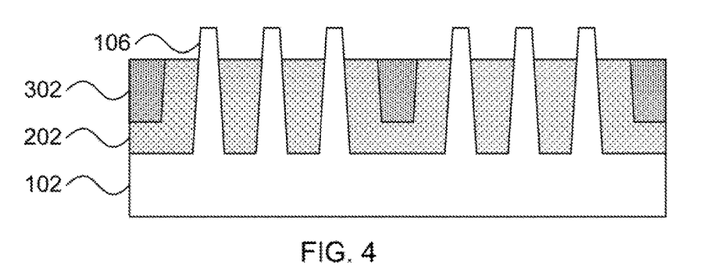
FIG. 4 is a cross-sectional diagram of a step in the formation of a semiconductor device in accordance with one embodiment of the present invention.

Referring now to FIG. 4, a cross sectional diagram of a step in the formation of a FET is shown. The fins 106 are revealed by an etch that etches the STI layer 302 and the dielectric layer 202 at roughly the same rate. The etch may be, for example, a wet or dry chemical etch or a timed anisotropic etch. The etch selectively removes material from these two layers without harming the fins 106. In the exemplary embodiment where the dielectric layer 202 is formed from silicon nitride and where the STI layer 302 is formed from silicon dioxide, it is specifically contemplated that RIE using $C_xH_yF_z$ may be used to etch both layers at the same etching rate. In alternative embodiments, the two layers may be selectively etched, for example etching the dielectric layer 202 first and the STI layer 302 second.

At this point, a gate or dummy gate structure may be formed over channel portions of the fins 106. The formation of the gate or dummy gate establishes the distinction between channel regions and source/drain regions, the latter of which being the areas of the fins 106 that are not covered by the gate or dummy gate. The following processes are directed specifically to the source/drain regions, with the channel regions being protected by the gate or dummy gate structure.

Figure 5:
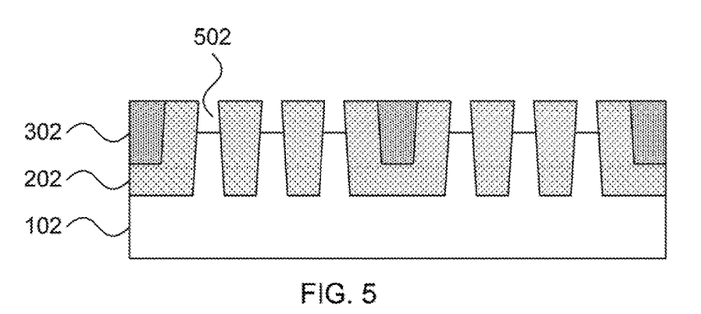
FIG. 5 is a cross-sectional diagram of a step in the formation of a semiconductor device in accordance with one embodiment of the present invention.

Referring now to FIG. 5, a cross sectional diagram of a step in the formation of a FET is shown. The fins 106 are selectively etched down to a level below a top surface of the dielectric layer 202 and the STI layer 302. This etch leaves gaps 502 above the tops of the recessed fins.

Figure 6:
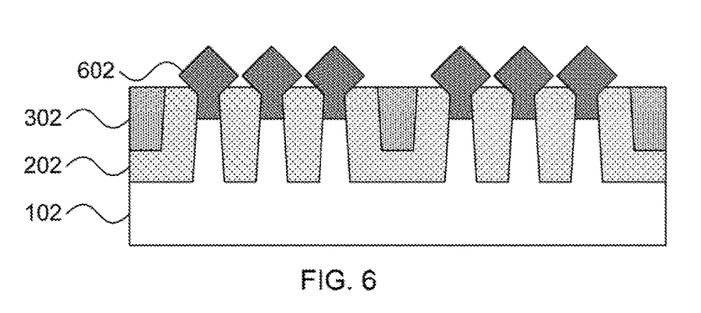
FIG. 6 is a cross-sectional diagram of a step in the formation of a semiconductor device in accordance with one embodiment of the present invention.

Referring now to FIG. 6, a cross sectional diagram of a step in the formation of a FET is shown. Epitaxial source/drain extensions 602 are grown from the top surface of the recessed fins, filling the gaps 502 and extending vertically and laterally outward. Although it is specifically contemplated that the source/drain extensions 602 do not contact or merge with one another to maximize the exposed surface area, it should be understood that some embodiments may include merged source/drain extensions.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

It is specifically contemplated that the source/drain extensions 602 are formed from the same semiconductor material as the semiconductor substrate 102, but it should be understood that other materials may be used instead. In addition, it should be noted that the source/drain extensions 602 may be in situ doped as appropriate for the FET in question. The dopant may be a p-type dopant or an n-type dopant.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

Figure 7:
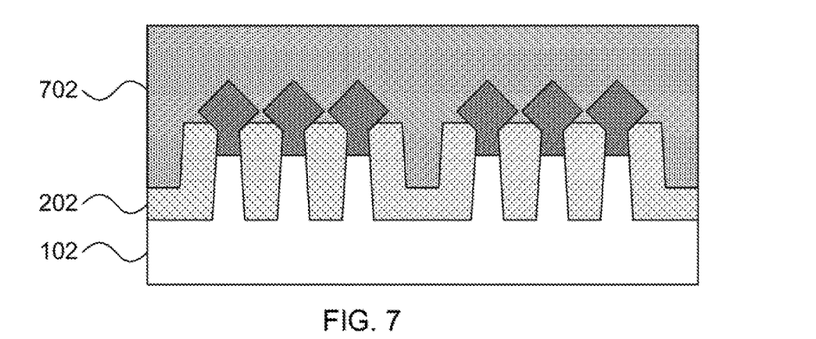
FIG. 7 is a cross-sectional diagram of a step in the formation of a semiconductor device in accordance with one embodiment of the present invention.

Referring now to FIG. 7, a cross sectional diagram of a step in the formation of a FET is shown. After the source/drain extensions 602 are grown, an additional layer of STI material is deposited to form STI layer 702. At this stage, if a dummy gate was formed previously over the channel region of the fins, that dummy gate may be removed and an appropriate replacement gate may be formed in its place.

Figure 8:
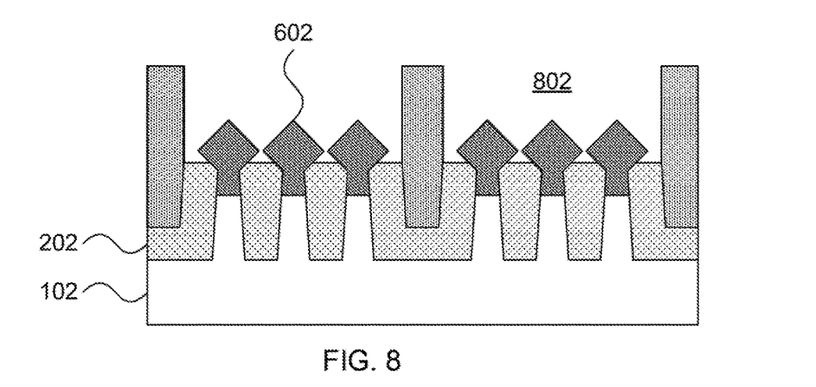
FIG. 8 is a cross-sectional diagram of a step in the formation of a semiconductor device in accordance with one embodiment of the present invention.

Referring now to FIG. 8, a cross sectional diagram of a step in the formation of a FET is shown. Regions of the STI layer 702 are masked and gaps 802 are lithographically etched using an anisotropic etch process, such as RIE, that selectively removes the exposed portions of the STI layer 702. This etch exposes the source/drain extensions 602.

Figure 9:
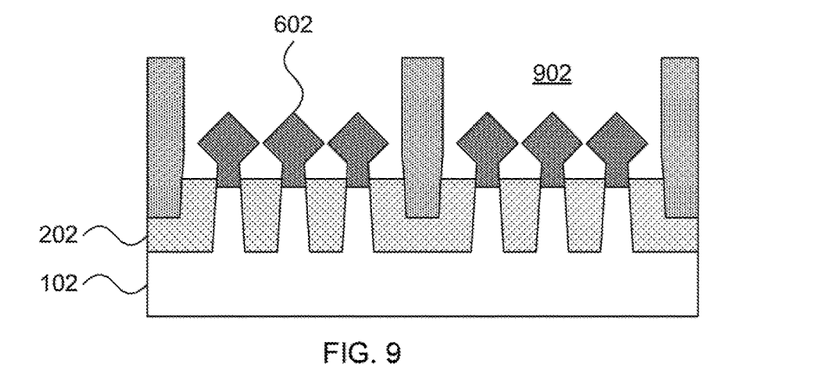
FIG. 9 is a cross-sectional diagram of a step in the formation of a semiconductor device in accordance with one embodiment of the present invention.

Referring now to FIG. 9, a cross sectional diagram of a step in the formation of a FET is shown. An etch is performed to recess the dielectric layer 202 around the source/drain fin extensions 602, enlarging the gap 902. This etch selectively removes the material from the dielectric layer 202 without harming the material of the STI region 702, as damaging the STI could cause a short circuit between neighboring devices. Because of the lateral extension of the source/drain extensions 602, an anisotropic etch cannot be used to remove material underneath the source/drain extensions.

Figure 10:
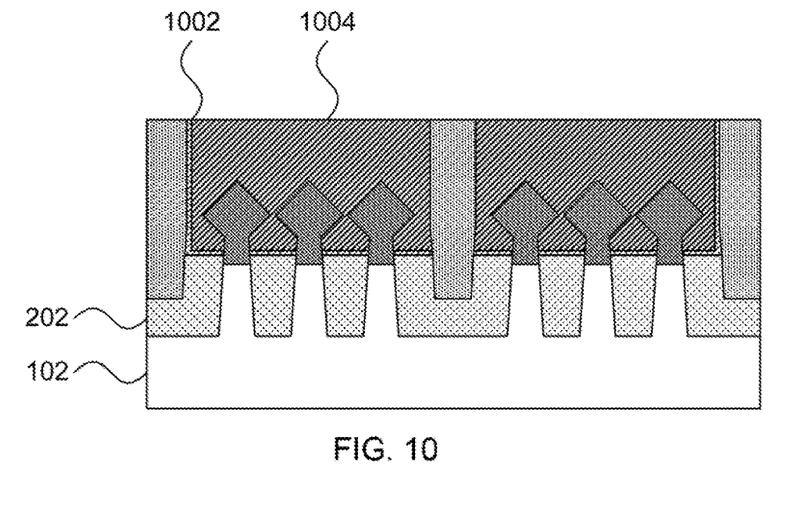
FIG. 10 is a cross-sectional diagram of a step in the formation of a semiconductor device in accordance with one embodiment of the present invention.

Referring now to FIG. 10, a cross sectional diagram of a step in the formation of a FET is shown. A thin conductive liner 1002 is conformally deposited using, e.g., ALD or CVD over the source/drain extensions 602 to form a conductive interface. For example, the conductive liner may be deposited as, e.g., titanium, nickel, or cobalt and annealed to form a silicide or silicide-like liner that reduces contact resistance. A conductive material is deposited in the gap 902 over the conductive liner 1002 to form contacts 1004. The conductive material may be any appropriate conductor including, for example, tungsten, copper, aluminum, silver, gold, and alloys thereof.

Figure 11:
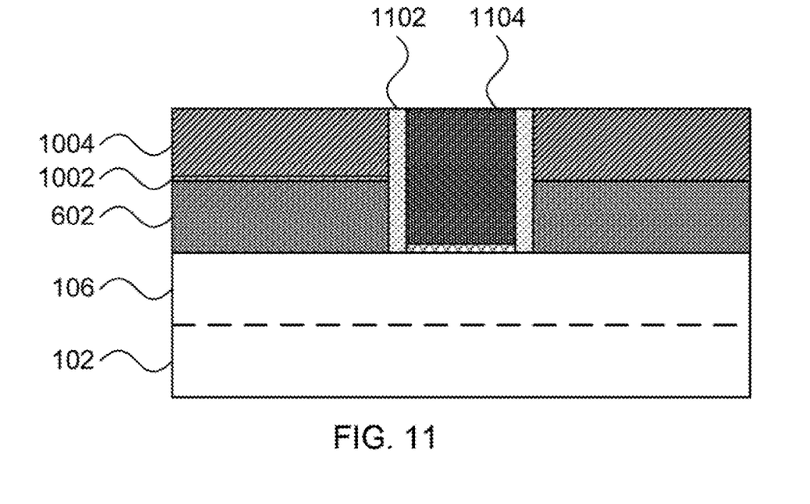
FIG. 11 is a cross-sectional diagram of a step in the formation of a semiconductor device in accordance with one embodiment of the present invention.

Referring now to FIG. 11, a cross sectional diagram of a finished FET is shown. This view takes a cross section that is perpendicular to the views of FIGS. 1-9, cut along the length of one of the fins 106. This view illustrates the gate stack 1104 and a dielectric spacer 1102 that separates the gate stack 1104 from the source and drain regions. As can be seen, the fin extensions 602 extend above the fins 106 on both sides of the gate 1104. The contact 1004 is shown above the fin extensions 602 and wraps around the fin extensions 602. The gate stack 1104 includes a gate conductor and a gate dielectric.

The gate dielectric is formed between the gate conductor and the fins 106. The gate dielectric can be formed from any appropriate dielectric material including silicon dioxide, silicon nitride, silicon oxynitride, and high-k dielectrics, such as titanium dioxide, aluminum oxides, zirconium dioxide, hafnium dioxide, tantalum oxides, and lanthanum oxides. The gate conductor can be formed from any appropriate conductive material including, e.g., polysilicon or a conductive metal such as tungsten, copper, platinum, silver, gold, ruthenium, iridium, rhenium, and rhodium.

After formation of the FET, electrical contacts can be made to the gate conductor and to the respective source and drain contacts 1004. These contacts can be of any appropriate conductor and provide integration of the device to the rest of an integrated circuit.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 12:
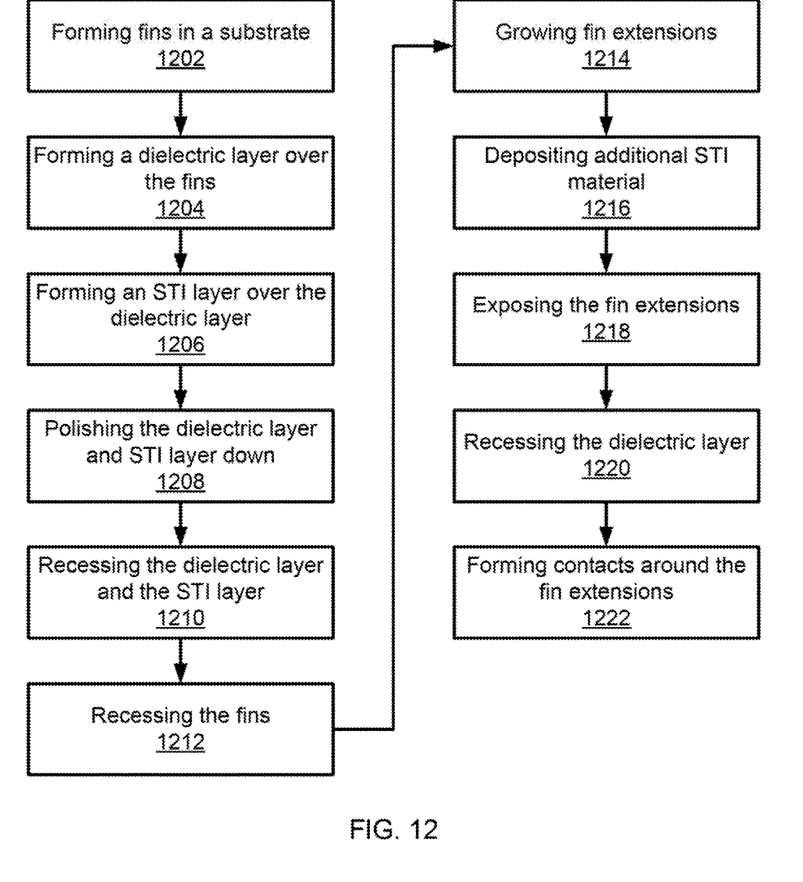
FIG. 12 is a block/flow diagram of a method of forming a semiconductor device in accordance with one embodiment of the present invention.

Referring now to FIG. 12, a method of forming a FET is shown. Block 1202 forms fins 106 out of a semiconductor substrate 102 using, for example, fin masks 104 to guide an anisotropic etch. Block 1204 conformally forms dielectric layer 202 over the fins 106 using, e.g., CVD, ALD, or PVD. The dielectric layer is specifically contemplated as being formed from silicon nitride, though it should be understood that any appropriate dielectric material may be used instead.

Block 1206 forms an STI layer 302 over the dielectric layer 202. The STI layer 302 is formed from a dielectric material, such as silicon dioxide, that is different from that of the dielectric layer 202. The STI layer 302 may be formed from any appropriate process, and it is specifically contemplated that a spin-on oxide fill may be employed. Block 1208 then polishes the STI layer 302 and the dielectric layer 202 down to the level of the fin masks 104 using, e.g., a CMP process.

The dielectric layer 202 and the STI layer 302 are then further recessed below the height of the fins 106 in block 1210. This may be performed using a single etch that targets both the material of the dielectric layer 202 and the material of the STI layer 302, or may alternatively be performed by multiple etches that target each material individually. Block 1212 then recesses the fins 106 down below the surface of the dielectric layer 202 and the STI layer 302, creating gaps 502.

Block 1214 epitaxially grows fin extensions 602 in the gaps 502, using the exposed top surface of the fins 106 as a seed layer. The fin extensions 602 extend vertically and laterally past the opening of the gap 502. Block 1216 deposits additional STI material (e.g., silicon dioxide) 702 around the fin extensions 602.

Block 1218 forms on the STI layer 702, leaving exposed regions that include the fin extensions 602, and etches away the STI material in the exposed regions to create gaps 802. Block 1220 then further recesses the dielectric layer 202 using, e.g., an isotropic etch to expose the underside and at least a part of the sidewalls of the fins of the fin extensions 602. Block 1220 forms the contacts 1004 and contact liners 1002 on the fin extensions 602, with enhanced contact area between the conductive material and the fin extensions 602 due to the fact that more of the fin extensions 602 are exposed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
   a plurality of semiconductor fins;

fin extension formed on respective source and drain regions of the plurality of semiconductor fins that extend vertically and laterally beyond boundaries of the plurality of semiconductor fins;

a first dielectric layer formed on sidewalls of the plurality of semiconductor fins and between the plurality of semiconductor fins, leaving at least a portion of sidewalls and an underside of the fin extension uncovered;

conductive contacts formed in contact with a top surface, the underside, and sidewalls of the respective fin extensions; and a conductive liner directly between the fin extensions and the conductive contacts that covers a top surface of the first dielectric layer between the plurality of semiconductor fins.

2. The semiconductor device of claim 1, wherein the first dielectric layer rises to a height above top surfaces of the plurality of semiconductor fins.

3. The semiconductor device of claim 1, wherein the fin extensions of each semiconductor fin do not contact one another.

4. The semiconductor device of claim 1, further comprising a second dielectric layer that bounds sidewalls of the conductive contacts.

5. The semiconductor device of claim 4, wherein the first dielectric layer is formed from silicon nitride and wherein the second dielectric layer is formed from silicon dioxide.

* * * * *